United States Patent
Kanzaki et al.

(10) Patent No.: US 9,413,238 B2
(45) Date of Patent: Aug. 9, 2016

(54) FEED CONTROL APPARATUS FOR INDUCTIVE LOAD WITH REDUCED POWER LOSS

(71) Applicant: Mitsubishi Electric Corporation, Chiyoda-ku, Tokyo (JP)

(72) Inventors: Shozo Kanzaki, Chiyoda-ku (JP); Koji Hashimoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 63 days.

(21) Appl. No.: 14/171,162

(22) Filed: Feb. 3, 2014

(65) Prior Publication Data

US 2015/0084612 A1     Mar. 26, 2015

(30) Foreign Application Priority Data

Sep. 26, 2013    (JP) ................................. 2013-199492

(51) Int. Cl.
    *H02M 3/156*      (2006.01)
    *H02M 3/158*      (2006.01)
          (Continued)

(52) U.S. Cl.
    CPC ......... *H02M 3/158* (2013.01); *H03K 17/08142* (2013.01); *H03K 17/6871* (2013.01); *H03K 17/6877* (2013.01); *H03K 17/74* (2013.01);
          (Continued)

(58) Field of Classification Search
    CPC ............... H02M 3/158; H02M 3/155; H02M 2003/1566; H02M 3/1588; H02M 3/156
    USPC ................................... 323/282; 327/108–110
    See application file for complete search history.

(56) References Cited

U.S. PATENT DOCUMENTS 5,671,115 A * 9/1997 Streich ................. H01H 47/325
                                                           361/154
5,933,312 A * 8/1999 Schuhbauer .......... H01F 7/1811
                                                           361/152

(Continued)

FOREIGN PATENT DOCUMENTS

DE             4229440 A1     3/1994
DE       102006049228 A1     4/2008

(Continued)

OTHER PUBLICATIONS

Communication dated Jan. 26, 2016 from the German Patent and Trademark Office in counterpart application No. 102014208447.4.

*Primary Examiner* — Jue Zhang
*Assistant Examiner* — LaKaisha Jackson
(74) *Attorney, Agent, or Firm* — Sughrue Mion, PLLC (57) ABSTRACT

In a feed control apparatus that controls a feed state for an inductive load by controlling the opening and closing of a load opening and closing element connected in series to the inductive load, a free-wheeling circuit element employing a field effect transistor is connected in parallel to the inductive load so that a capacitor is charged by opening the free-wheeling circuit element when the load opening and closing element is closed and the free-wheeling circuit element is closed by charges charged to the capacitor when the load opening and closing element is opened. A connection is made in polarity in which a closed-circuit conduction direction in the free-wheeling circuit element is the same as a conduction direction in an internal parasitic diode of the free-wheeling circuit element, and the free-wheeling circuit element conducts backward by a small-capacity capacitor. Consequently, a voltage drop and a temperature rise are reduced.

6 Claims, 4 Drawing Sheets

100A: FEED CONTROL APPARATUS
103: INDUCTIVE LOAD
130A: LOAD OPENING AND CLOSING ELEMENT
140: FREE-WHEELING CIRCUIT ELEMENT
149: PARASITIC DIODE (51) Int. Cl.
*H03K 17/0814* (2006.01)
*H03K 17/687* (2006.01)
*H03K 17/74* (2006.01)
*H02M 3/155* (2006.01)

(52) U.S. Cl.
CPC ............... *H02M 3/155* (2013.01); *H02M 3/156* (2013.01); *H02M 3/1588* (2013.01); *H02M 2003/1555* (2013.01); *H02M 2003/1566* (2013.01); *H03K 2217/0036* (2013.01)

(56) References Cited

U.S. PATENT DOCUMENTS

| | | | | |
|---|---|---|---|---|
| 5,936,446 | A * | 8/1999 | Lee | G05F 1/613 327/108 |
| 6,717,784 | B2 * | 4/2004 | Isago | H02H 9/001 323/222 |
| 6,738,239 | B2 * | 5/2004 | Petruska | H02P 7/0044 361/23 |
| 7,692,908 | B2 * | 4/2010 | Chen | H02H 11/002 307/127 |
| 2009/0206812 | A1 * | 8/2009 | Sasaya | H02M 3/1588 323/282 |
| 2011/0227640 | A1 | 9/2011 | Kyono | |
| 2012/0025794 | A1 * | 2/2012 | Inoue | H02M 3/158 323/271 |
| 2012/0188675 | A1 * | 7/2012 | Oppermann | H01F 7/1811 361/91.6 |

FOREIGN PATENT DOCUMENTS

| | | |
|---|---|---|
| JP | 08-308116 A | 11/1996 |
| JP | 2005-143282 A | 6/2005 |
| JP | 2011-200016 A | 10/2011 |

\* cited by examiner

FEED CONTROL APPARATUS FOR INDUCTIVE LOAD WITH REDUCED POWER LOSS

BACKGROUND OF THE INVENTION

1. Field of the Invention

The present invention relates to a feed control apparatus for an inductive load forming, for example, an in-vehicle electronic control device, and more particularly, to a feed control apparatus for an inductive load improved so as to suppress a power loss occurring in a feed control circuit part.

2. Description of the Related Art

To a general DC electric load including an inductive load, a reverse-connection protection diode is connected in series in order to prevent a burnout caused by a power-supply short circuit when the power supply is erroneously connected in reverse polarity. Also, a field effect transistor is used to suppress the occurrence of a power loss due to a voltage drop across the reverse-connection protection diode during normal operation when the power supply is connected in proper polarity. For example, according to JP-A-08-308116 (Patent Document 1), as is shown in FIG. 7 of this gazette, a pair of power-supply terminals 2 and 3, to which a DC power supply 1 is connected, is provided, and an FET 10 is connected between a pair of the power-supply terminals 2 and 3 via a circuit 4 as an object to be protected.

By connecting the FET 10 so that there is a directionality in which a current flows from a source to a drain when the DC power supply 1 is connected properly, and by connecting a gate of the FET 10 to one power-supply terminal 2 via a resistor 11, a back-flow prevention circuit having small voltage drop and power loss during normal operation is provided.

In Patent Document 1, an N-channel field effect transistor is employed as a reverse-connection protection element on a downstream side of the DC power supply 1 and the FET 10 is driven to conduct in a direction same as that in an internal parasitic diode.

Also, according to JP-A-2011-200016 (Patent Document 2), as is shown in FIG. 2 of this gazette, back-flow prevention diodes D1 and D2 of FIG. 1 are replaced with MOSFETs, so that in the event of a voltage drop due to an abnormality in one power supply device while power supply devices 1 and 2 are connected in parallel and supplying power to a load device 3, a current is prevented from flowing backward from the other normal power supply device to the power supply device having an abnormality.

In Patent Document 2, for example, P-channel field effect transistors are employed as reverse-connection prevention elements on an upstream side of the power supply devices 1 and 2 and these FETQ1 and FETQ2 are driven to conduct in a direction same as that in internal parasitic diodes.

Meanwhile, according to JP-A-2005-143282 (Patent Document 3), as is shown in FIG. 1 of this gazette, a series circuit made up of a first MOSFET transistor Q1 and a reactance L is connected between a DC power supply B and a load 1. A second MOSFET transistor Q2 is provided between a connection point of the first transistor Q1 and the reactance L and the ground. Both of the transistors Q1 and Q2 are switched ON and OFF by providing a dead period to during which both of the transistors Q1 and Q2 are switched OFF simultaneously using a step-down PWM converter which is installed between a connection point of the reactance L and the load 1 and the ground, and to which a smoothing capacitor C is connected. When configured in this manner, a switching loss is reduced by preventing a current from flowing to parasitic diodes D1 and D2 in the second MOSFET transistor Q2.

In Patent Document 3, the second MOSFET transistor Q2, which is an N-channel field effect transistor, is controlled so as to conduct in a direction opposite to the conduction direction in the parasitic diode D2, so that charges charged to the smoothing capacitor C are discharged quickly.

Reference numerals and signs used in the description of the respective patent documents above are those used in the respective patent documents.

Patent Document 1: JP-A-08-308116 (Abstract, paragraph 0017, FIG. 3, and FIG. 7)
Patent Document 2: JP-A-2011-200016 (Abstract, FIG. 2)
Patent Document 3: JP-A-2005-143282 (Abstract, FIG. 1)

According to Patent Document 1 and Patent Document 2 above, field effect transistors having a small closed-circuit voltage drop are employed instead of back-flow prevention diodes. During normal operation, a gate voltage is continuously applied to the field effect transistor from the DC power supply, so that a current is passed continuously at low power consumption. A field effect transistor can be driven to conduct in either direction between the source terminal and the drain terminal depending on in which manner a gate voltage is provided. When used as an opening and closing element, the field effect transistor is driven in a forward direction so that it is driven to close in a direction opposite to the conduction direction in the internal parasitic diode. On the contrary, when used as a back-flow prevention diode, the field effect transistor is driven in a backward direction so that it is driven in a direction same as the conduction direction in the parasitic diode.

The techniques disclosed in Patent Document 1 and Patent Document 2, however, do not present a concept to employ field effect transistors as a free-wheeling diode for an inductive load.

On the other hand, according to Patent Document 3, the internal parasitic diode in the field effect transistor is used as a free-wheeling diode for an inductive load. A voltage drop by this parasitic diode takes a large value in comparison with a closed-circuit voltage between the source terminal and the drain terminal. Accordingly, there is a problem that power consumption increases when a large current flows and hence a temperature rises high.

SUMMARY OF THE INVENTION

A first object of the invention is to provide a compact and inexpensive feed control apparatus for an inductive load that reduces a power loss occurring in a free-wheeling circuit element connected in parallel to the inductive load, and thereby suppresses a temperature rise in the free-wheeling circuit element.

A second object of the invention is to provide a feed control apparatus for an inductive load provided with a compact and inexpensive gate drive circuit for a field effect transistor employed as a free-wheeling circuit element.

A third object of the invention is to provide a feed control apparatus for an inductive load capable of preventing the occurrence of a power-supply short circuit state arising when a load opening and closing element connected in series to the inductive load and a field effect transistor employed as a free-wheeling circuit element conduct simultaneously.

A feed control apparatus for an inductive load according to an aspect of the invention is a feed control apparatus for an inductive load, including: a load opening and closing element connected in series to an inductive load fed from a DC power supply, and a free-wheeling circuit element connected in parallel to the inductive load, to which an exciting current that has been flown to the inductive load is diverted when the load opening and closing element is changed from a closed-circuit feeding state to an opened-circuit cutoff state.

The free-wheeling circuit element employs an N-channel or P-channel field effect transistor. The feed control apparatus includes: a cutoff transistor that brings the free-wheeling circuit element into a non-conducting state by short-circuiting a gate terminal and a source terminal of the free-wheeling circuit element when the load opening and closing element is closed; a capacitor that is charged via a charge diode when the load opening and closing element is closed; a drive resistor that opens the cutoff transistor and also applies a charging voltage of the capacitor between the gate terminal and the source terminal of the free-wheeling circuit element when the load opening and closing element is opened. When the load opening and closing element is opened, the free-wheeling circuit element is driven to conduct in a direction same as a conduction direction in a parasitic diode generated between the source terminal and a drain terminal.

The feed control apparatus for an inductive load of the invention is a feed control apparatus that controls a feed state to the inductive load by controlling the opening and closing of the load opening and closing element connected in series to the inductive load. Herein, the free-wheeling circuit element employing a field effect transistor is connected in parallel to the inductive load in a relation such that the capacitor is charged via the charge diode by opening the free-wheeling circuit element when the load opening and closing element is closed and the free-wheeling circuit element is closed by charges charged to the capacitor when the load opening and closing element is opened. Moreover, a connection is made in polarity in which a closed-circuit conduction direction in the free-wheeling circuit element is a direction same as a conduction direction in the internal parasitic diode of the free-wheeling circuit element. Accordingly, in comparison with a case where a general diode or a parasitic diode is employed as a free-wheeling diode, a voltage drop across the free-wheeling circuit element during a free-wheeling period is reduced markedly and a temperature rise due to heat generation in the free-wheeling circuit element is lowered markedly. Hence, there can be achieved an advantage that the feed control apparatus can be more compact and less expensive.

Also, the power supply used to drive the free-wheeling circuit element to close in the free-wheeling period employs a capacitor charged via the charge diode while the load opening and closing element is opened. This capacitor is used at a load as light as to apply a gate voltage to the field effect transistor in a short period during which a current of the inductive load attenuates. Hence, there can be achieved an advantage that a compact and inexpensive gate drive circuit can be formed using a small-capacity capacitor.

Further, when the load opening and closing element is closed, the free-wheeling circuit element is opened by the cutoff transistor, so that the free-wheeling circuit element is prevented from conducting in a direction opposite to the conduction direction in the internal parasitic diode. Hence, there can be achieved an advantage that it becomes possible to prevent the occurrence of a power-supply short circuit state arising when the load opening and closing element and the free-wheeling circuit element conduct simultaneously.

The foregoing and other objects, features, aspects, and advantages of the present invention will become more apparent from the following detailed description of the present invention when taken conjunction with the accompanying drawings.

DETAILED DESCRIPTION OF THE PREFERRED EMBODIMENTS

Hereinafter, preferred embodiments of a feed control apparatus for an inductive load of the invention will be described using the drawings. Descriptions will be given by labeling same or equivalent portions with same reference numerals in the respective drawings.

First Embodiment (1) Detailed Description of Configuration

Figure 1:
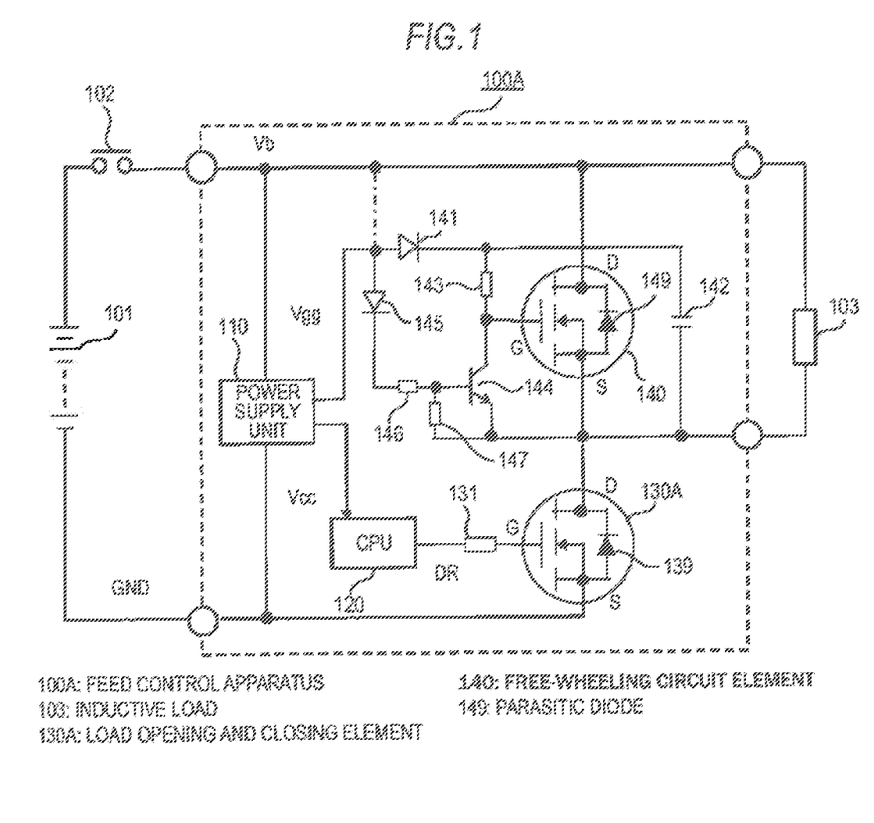
FIG. 1 is an overall circuit diagram of a feed control apparatus for an inductive load according to a first embodiment of the invention.

Firstly, a configuration of a feed control apparatus for an inductive load according to a first embodiment of the invention will be described in detail. FIG. 1 is an overall circuit diagram of the feed control apparatus for an inductive load of the first embodiment. Referring to FIG. 1, a feed control apparatus 100A is fed from a DC power supply 101, which is, for example, an in-vehicle battery, via a power supply switch 102, which is an output contact of a power supply relay, and feeds an inductive load 103, which is, for example, a magnet coil, so as to supply a predetermined exciting current by simply driving the inductive load 103 to be ON or OFF or by controlling an ON duty, which is a ratio of an ON time with respect to ON and OFF periods.

A power supply unit 110 provided inside the feed control apparatus 100A is fed with a power supply voltage Vb from the DC power supply 101 and generates a control voltage Vcc of a stabilized voltage, for example, of DC 5 V, as a predetermined stabilized voltage and an auxiliary voltage Vgg.

To an opening and closing command generation unit 120, the control voltage Vcc is applied and an opening and closing command signal DR is generated by an unillustrated in-built micro-processor.

A load opening and closing element 130A is, for example, an N-channel field effect transistor connected in series to the inductive load 103 on a downstream side. A signal voltage by the opening and closing command signal DR is supplied between a gate terminal G and a source terminal S via a drive resistor 131. When the logic level of the opening and closing command signal DR shifts to "H", the load opening and closing element 130A starts conducting between the drain terminal D and the source terminal S in a forward direction, so that the inductive load 103 is fed from the DC power supply 101 via the power supply switch 102. Also, when the logic level of the opening and closing command signal DR shifts to "L", conduction between the drain terminal D and the source terminal S of the load opening and closing element 130A is cut off, so that an exciting current that has been flown to the inductive load 103 is diverted to a free-wheeling circuit element 140 described below.

The load opening and closing element 130A may be an NPN junction transistor. However, a field effect transistor is advantageous in that a closed-circuit inter-element voltage drop becomes extremely small and a power loss is suppressed. It should be noted, however, that when a field effect transistor is used, a parasitic diode 139 is generated between the drain terminal D and the source terminal S in a direction indicated in the drawing and the field effect transistor is not furnished with a cut-off function as an opening and closing element for a conduction direction in the parasitic diode 139.

The free-wheeling circuit element 140 is an N-channel field effect transistor connected in parallel to the inductive load 103. The free-wheeling circuit element 140 is configured in such a manner that an exciting current can be diverted therein through a parasitic diode 149 when the load opening and closing element 130A is opened. It should be noted, however that the diverted current is not sustained in the parasitic diode 149 in practice because the free-wheeling circuit element 140 conducts backward in a direction from the source terminal S to the drain terminal D and a voltage drop caused by backward conduction is small.

A charge diode 141 forming a gate drive circuit for the free-wheeling circuit element 140 charges a capacitor 142 with the auxiliary voltage Vgg in a period during which the load opening and closing element 130A is closed. A cutoff transistor 144 connected between a gate terminal G and the source terminal S of the free-wheeling circuit element 140 is driven to conduct via a cutoff diode 145 and a base resistor 146. As a result, the free-wheeling circuit element 140 is prevented from conducting in a forward direction (a direction opposite to the conduction direction in the parasitic diode 149). An opened-circuit stabilizing resistor 147 is connected between a base terminal and an emitter terminal of the cutoff transistor 144, which is an NPN junction transistor. The cutoff diode 145 is provided so as to prevent a backward voltage from being applied between the emitter and base terminals of the cutoff transistor 144 while the load opening and closing element 130A is opened. The cutoff diode 145 can be connected in series to the base resistor 146 as is shown in FIG. 1 or alternatively can be connected in parallel to the opened-circuit stabilizing resistor 147.

When the load opening and closing element 130A is opened, the cutoff transistor 144 ceases to conduct because emitter potential of the cutoff transistor 144 rises to or above the power supply voltage Vb, and also a charging voltage of the capacitor 142 is applied between the gate terminal G and the source terminal S of the free-wheeling circuit element 140 via the drive resistor 143. The free-wheeling circuit element 140 thus conducts backward in a direction from the source terminal S to the drain terminal D. The auxiliary voltage Vgg is applied to positive-electrode terminals of the charge diode 141 and the cutoff diode 145. It should be appreciated, however, that the power supply voltage Vb may be applied instead of the auxiliary voltage Vgg. In this case, it becomes necessary to use a large capacitor by increasing a withstand voltage of the capacitor 142 and power consumption of the base resistor 146 tends to increase. However, the cutoff diode 145 can be omitted.

The charges charged to the capacitor 142 are lost as an opened-circuit state of the load opening and closing element 130A continues. However, a circuit configuration herein is that a small-capacity capacitor can be used as the capacitor 142 because it is only necessary to maintain a gate voltage for the free-wheeling circuit element 140 in a period since an exciting current of the inductive load 103 is diverted until the exciting current is lost by attenuation.

(2) Detailed Description of Function and Operation

A function and an operation of the feed control apparatus for an inductive load of the first embodiment configured as in FIG. 1 will now be described in detail.

Referring to FIG. 1, when the power supply switch 102 is closed and the power supply unit 110 is fed, the micro-processor in the opening and closing command generation unit 120 starts to operate with the control voltage Vcc generated by the power supply unit 110. Then, in response to an operation state of an input signal for the unillustrated micro-processor and the content of a control program, the opening and closing command generation unit 120 generates an opening and closing command signal DR exhibiting the logic level that shifts to "H" or "L".

When the logic level of the opening and closing command signal DR shifts to "H", a gate voltage is applied between the gate terminal G and the source terminal S of the load opening and closing element 130A, and the load opening and closing element 130A is driven to conduct in a forward direction, that is, a direction from the drain terminal D to the source terminal S. An exciting current for the inductive load 103 is thus flown. It should be noted, however, that the free-wheeling circuit element 140 is in a non-conducting state because a gate voltage between the gate terminal G and the source terminal S of the free-wheeling circuit element 140 is cut off as the cutoff transistor 144 conducts, and also the capacitor 142 is charged from the charge diode 141.

When the logic level of the opening and closing signal DR shifts to "L", a conducting state between the drain terminal D and the source terminal S of the load opening and closing element 130A is cut off. The exciting current for the inductive load 103 is thus temporarily diverted to the parasitic diode 149 in the free-wheeling circuit element 140. However, as the cutoff transistor 144 ceases to conduct and a charging voltage of the capacitor 142 is applied between the gate terminal G and the source terminal S via the drive resistor 143, the free-wheeling circuit element 140 starts to conduct backward in a direction from the source terminal S to the drain terminal D and the diverted current of the inductive load 103 is switched to the backward conduction circuit side from the side of the parasitic diode 149.

(3) Gist and Characteristics of First Embodiment

As is obvious from the description above, a feed control apparatus for an inductive load of the first embodiment is the feed control apparatus 100A for an inductive load, including: the load opening and closing element 130A connected in series to the inductive load 103 fed from the DC power supply 101, and the free-wheeling circuit element 140 connected in parallel to the inductive load 103, to which an exciting current that has been flown to the inductive load 103 is diverted when the load opening and closing element 130A is changed from a closed-circuit feeding state to an opened-circuit cutoff state.

The free-wheeling circuit element 140 employs an N-channel field effect transistor. The feed control apparatus 100A includes: the cutoff transistor 144 that brings the free-wheeling circuit element 140 into a non-conducting state by short-circuiting the gate terminal G and the source terminal S of the free-wheeling circuit element 140 and the capacitor 142 that is charged via the charge diode 141 when the load opening and closing element 130A is closed; and the drive resistor 143 that opens the cutoff transistor 144 and also applies a charging voltage of the capacitor 142 between the gate terminal G and the source terminal S of the free-wheeling circuit element 140 when the load opening and closing element 130A is opened.

When the load opening and closing element 130A is opened, the free-wheeling circuit element 140 is driven to conduct in a direction same as a conduction direction in the parasitic diode 149 generated between the source terminal and the drain terminal.

The load opening and closing element 130A is connected at a negative-side downstream position of the inductive load 103. The free-wheeling circuit element 140 connected in parallel to the inductive load 103 is an N-channel field effect transistor and the cutoff transistor 144 is an NPN junction transistor connected between the gate terminal G and the source terminal S of the free-wheeling circuit element 140.

As has been described above, relating to the third characteristic of the invention, an N-channel field effect transistor is employed as the free-wheeling circuit element at an upstream position of the load opening and closing element and connected in parallel to the inductive load. The cutoff transistor connected between the gate terminal G and the source terminal S of this transistor employs an NPN junction transistor having a faster response speed than the field effect transistor. Accordingly, when the load opening and closing element is closed, the cutoff transistor starts conducting faster than the free-wheeling circuit element starts conducting and thereby inhibits conduction of the free-wheeling circuit element. Hence, there is a characteristic that it becomes possible to prevent the occurrence of a power-supply short circuit arising when the free-wheeling circuit element and the load opening and closing element conduct simultaneously.

Also, either the power supply voltage Vb of the DC power supply 101 or the auxiliary voltage Vgg, which is a voltage lower than the power supply voltage Vb, is applied to the base resistor 146 that drives the charge diode 141 connected in series to the capacitor 142 and the cutoff transistor 144 to conduct.

As has been described above, relating to the fourth characteristic of the invention, either the power supply voltage of the DC power supply or the auxiliary voltage, which is a voltage lower than the power supply voltage, is applied to the base resistor that drives the charge diode connected in series to the capacitor and the cutoff transistor. Hence, there is a characteristic that because the base voltage of the cutoff transistor is as high as or lower than the power supply voltage, the cutoff transistor conducts when the load opening and closing element is opened, so that the free-wheeling circuit element can be prevented from ceasing to conduct. Also, there is a characteristic that in a case where the auxiliary voltage is used, not only does it become possible to suppress power consumed by driving the cutoff transistor to conduct when the load opening and closing element is closed, but it also becomes possible to lower a withstand voltage of the capacitor.

Second Embodiment (1) Detailed Description of Configuration

Figure 2:
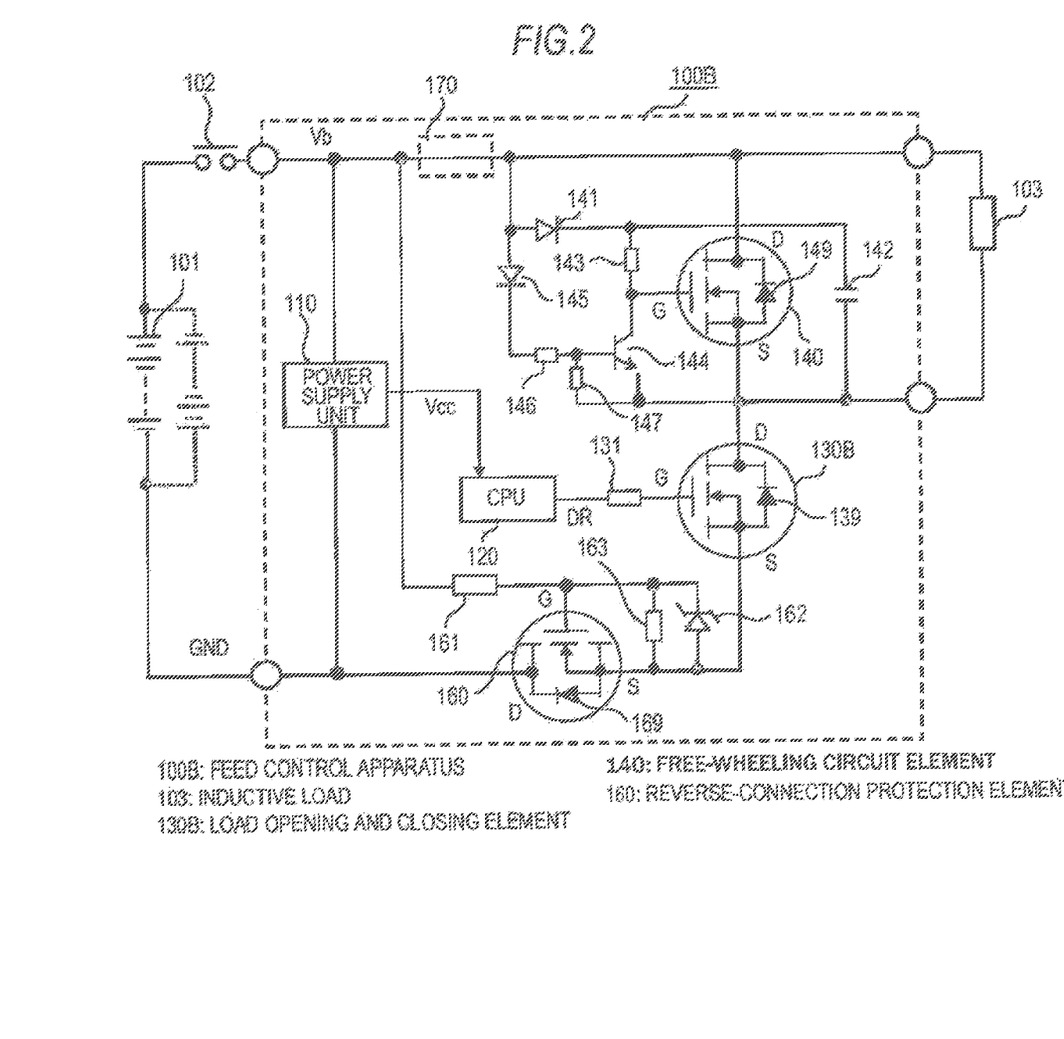
FIG. 2 is an overall circuit diagram of a feed control apparatus for an inductive load according to a second embodiment of the invention.

A feed control apparatus for an inductive load according to a second embodiment of the invention will now be described. FIG. 2 is an overall circuit diagram of the feed control apparatus for an inductive load of the second embodiment, and a configuration, chiefly differences from the first embodiment above, will be described in detail.

Major differences from the first embodiment above are that a reverse-connection protection element 160 is additionally provided so as to prevent the occurrence of a short circuit current in a case where a DC power supply 101 is erroneously connected in reverse polarity and that a power supply unit 110 does not have an auxiliary voltage Vgg in the second embodiment. Reference numerals in FIG. 2 same as those of FIG. 1 denote same or equivalent portions.

Referring to FIG. 2, a feed control apparatus 100B is fed from a DC power supply 101 via a power supply switch 102 and feeds an inductive load 103. A power supply unit 110 provided inside the feed control apparatus 100B is fed with a power supply voltage Vb from the DC power supply 101 and generates a control voltage Vcc. The control voltage Vcc is applied to an opening and closing command generation unit 120 and an opening and closing command signal DR is generated by an unillustrated built-in micro-processor. On a downstream side of the inductive load 103, a load opening and closing element 130B, which is an N-channel field effect transistor, and a reverse-connection protection element 160, which is an N-channel field effect transistor and connected in series to the load opening and closing element 130B in an opposite direction, are connected in series to each other.

A signal voltage by the opening and closing command signal DR is supplied between a gate terminal G and a source terminal S of the load opening and closing element 130B via a drive resistor 131. When the logic level of the opening and closing command signal DR shifts to "H", the load opening and closing element 130B starts conducting between the drain terminal D and the source terminal S in a forward direction. The inductive load 103 is thus fed from the DC power supply 101 via the power supply switch 102. When the logic level of the opening and closing command signal DR shifts to "L", conduction between the drain terminal D and the source terminal S of the load opening and closing element 130B is cut off. An exciting current that has been flown to the inductive load 103 is thus diverted to a free-wheeling circuit element 140 described below.

The free-wheeling circuit element 140 is an N-channel field effect transistor connected in parallel to the inductive load 103. The free-wheeling circuit element 140 is configured in such a manner that an exciting current can be diverted therein through a parasitic diode 149 when the load opening and closing element 130B is opened. It should be noted, however that the diverted current is not sustained in the parasitic diode 149 in practice because the free-wheeling circuit element 140 conducts backward in a direction from the source terminal S to the drain terminal D and a voltage drop caused by backward conduction is small.

A charge diode 141 forming a gate drive circuit for the free-wheeling circuit element 140 charges a capacitor 142 with the power supply voltage Vb of the DC power supply 101 in a period during which the load opening and closing element 130B is closed. A cutoff transistor 144 connected between a gate terminal G and the source terminal S of the free-wheeling circuit element 140 is driven to conduct via a base resistor 146. As a result, the free-wheeling circuit element 140 is prevented from conducting in a forward direction (a direction opposite to the conduction direction in the parasitic diode 149). An opened-circuit stabilizing resistor 147 is connected between a base terminal and an emitter terminal of the cutoff transistor 144, which is an NPN junction transistor.

The auxiliary voltage Vgg in the first embodiment above is not used in the second embodiment. Hence, the cutoff diode 145 (indicated by a broken line in FIG. 2) connected in series to the base resistor 146 is unnecessary herein. When the load opening and closing element 130B is opened, the cutoff transistor 144 ceases to conduct because emitter potential of the cutoff transistor 144 rises to or above the power supply voltage Vb, and also a charging voltage of the capacitor 142 is applied between the gate terminal G and the source terminal S of the free-wheeling circuit element 140 via the drive resistor 143. The free-wheeling circuit element 140 thus conducts backward in a direction from the source terminal S to the drain terminal D.

The power supply voltage Vb is applied to a gate terminal G of the reverse-connection protection element 160 via a drive resistor 161. However, in practice, a voltage divided by a gate resistor 163 connected between the gate terminal G and a source terminal S is applied and also an applied voltage is limited by a constant voltage diode 162 so that a voltage as high as or higher than a clamping voltage allowed between the gate terminal G and the source terminal S is not applied even when the power supply voltage Vb fluctuates. As a result, the reverse-connection protection element 160 conducts backward in a direction from the source terminal S to the drain terminal D, and suppresses a voltage drop between the source terminal S and the drain terminal D during normal operation by conducting in a direction same as the conduction direction in an internal parasitic diode 169. In a case where the DC power supply 101 is erroneously connected in reverse polarity as is indicated by a dotted line in the drawing, the reverse-connection protection element 160 ceases to conduct. It thus becomes possible to prevent the occurrence of a power-supply short circuit by a series circuit made up of the parasitic diode 139 in the load opening and closing element 130B and the parasitic diode 149 in the free-wheeling circuit element 140. Alternatively, the reverse-connection protection element 160 may be replaced with a reverse-connection protection element 170 described below with reference to FIG. 4, in which case the reverse-connection protection element 170 is connected at the position indicated by a dotted line in FIG. 2.

(2) Detailed Description of Function and Operation

A function and an operation of the feed control apparatus for an inductive load of the second embodiment will now be described in detail.

Referring to FIG. 2, when the power supply switch 102 is closed and the power supply unit 110 is fed, the micro-processor in the opening and closing command generation unit 120 starts to operate with the control voltage Vcc generated by the power supply unit 110. Then, in response to an operation state of an input signal for the unillustrated micro-processor and the content of a control program, the opening and closing command generation unit 120 generates the opening and closing command signal DR exhibiting the logic level that shifts to "H" or "L". When the logic level of the opening and closing command signal DR shifts to "H", a gate voltage is applied between the gate terminal G and the source terminal S of the load opening and closing element 130B, and the load opening and closing element 130B is driven to conduct in a forward direction, which is a direction from the drain terminal D to the source terminal S. An exciting current for the inductive load 103 is thus flown. It should be noted, however, that the free-wheeling circuit element 140 is in a non-conducting state because a gate voltage between the gate terminal G and the source terminal S of the free-wheeling circuit element 140 is cut off as the cutoff transistor 144 conducts, and also the capacitor 142 is charged from the charge diode 141.

When the logic level of the opening and closing command signal DR shifts to "L", a conducting state between the drain terminal D and the source terminal S of the load opening and closing element 130B is cut off, and the exciting current for the inductive load 103 is temporarily diverted to the parasitic diode 149 in the free-wheeling circuit element 140. However, as the cutoff transistor 144 ceases to conduct and a charging voltage of the capacitor 142 is applied between the gate terminal G and the source terminal S via the drive resistor 143, the free-wheeling circuit element 140 starts to conduct backward in a direction from the source terminal S to the drain terminal D. The diverted current of the inductive load 103 is thus switched to the backward conduction circuit side from the side of the parasitic diode 149.

On the other hand, in a case where the DC power supply 101 is connected in proper polarity, a voltage drop between the source terminal S and the drain terminal D is suppressed by allowing the reverse-connection protection element 160 to conduct in a direction same as the conduction direction in the internal parasitic diode 169. On the contrary, in a case where the DC power supply 101 is erroneously connected in reverse polarity, the occurrence of a power-supply short circuit abnormality is prevented by allowing the reverse-connection protection element 160 to cease to conduct.

(3) Gist and Characteristics of Second Embodiment

As is obvious from the description above, a feed control apparatus for an inductive load of the second embodiment is the feed control apparatus 100B for an inductive load, including: the load opening and closing element 130B connected in series to the inductive load 103 fed from the DC power supply 101, and the free-wheeling circuit element 140 connected in parallel to the inductive load 103, to which an exciting current that has been flown to the inductive load 103 is diverted when the load opening and closing element 130B is changed from a closed-circuit feeding state to an opened-circuit cutoff state.

The free-wheeling circuit element 140 employs an N-channel field effect transistor. The feed control apparatus 100B includes: the cutoff transistor 144 that brings the free-wheeling circuit element 140 into a non-conducting state by short-circuiting the gate terminal G and the source terminal S of the free-wheeling circuit element 140, and the capacitor 142 that is charged via the charge diode 141 when the load opening and closing element 130B is closed; and the drive resistor 143 that opens the cutoff transistor 144 and also applies a charging voltage of the capacitor 142 between the gate terminal G and the source terminal S of the free-wheeling circuit element 140 when the load opening and closing element 130B is opened.

When the load opening and closing element 130B is opened, the free-wheeling circuit element 140 is driven to conduct in a direction same as a conduction direction in the parasitic diode 149 generated between the source terminal and the drain terminal.

The load opening and closing element 130B is an N-channel field effect transistor. The gate terminal G of the load opening and closing element 130B8B is driven to open and close by an opening and closing command signal DR generated by the opening and closing command generation unit 120. The opening and closing command generation unit 120 is fed from the power supply unit 110 fed from the DC power supply 101 and generates the predetermined control voltage Vcc. The reverse-connection protection element 160 connected in series to a series circuit made up of the free-wheeling circuit element 140 and the load opening and closing element 130B is further connected in series to the power supply unit 110 at a downstream position. The reverse-connection protection element 160 employs an N-channel field effect transistor including the parasitic diode 169, and to which is connected the drive resistor 161 applying a gate voltage so that the reverse-connection terminal 160 is driven to close in a direction same as a conduction direction in the parasitic diode 169 when the DC power supply 101 is connected in proper polarity, and conduction of the reverse-connection protection element 160 is prevented when the DC power supply 101 is erroneously connected in reverse polarity.

As has been described, relating to the second characteristic of the invention, the load opening and closing element employs a field effect transistor. The reverse-connection protection element, which is a field effect transistor, is connected in series to a series circuit made up of the load opening and closing element and the free-wheeling circuit element. The opening and closing command generation unit that applies an opening and closing command signal to the load opening and closing element is fed from the power supply unit connected between the DC power supply and the reverse-connection protection element.

Hence, there is a characteristic that when the DC power supply is erroneously connected in reverse polarity, it becomes possible to prevent a power-supply short circuit using the internal parasitic diodes of the load opening and closing element and the free-wheeling circuit element. Also, there is a characteristic that a voltage drop by the reverse-connection protection element and the load opening and closing element during normal operation takes a sufficiently small value in comparison with that across one junction transistor during normal operation, so that power consumption and a temperature rise due to heat generation can be suppressed.

Also, there is a characteristic that even in a case where the reverse-connection protection element is melted and disconnected by overheating due to a load short circuit abnormality, a positive-line earth fault abnormality of the load, or a negative-line power-supply fault abnormality of the load, the power supply unit and the opening and closing command generation unit can continue to operate normally and perform abnormality processing, such as to detect and notify the occurrence of an abnormality.

Third Embodiment (1) Detailed Description of Configuration

Figure 3:
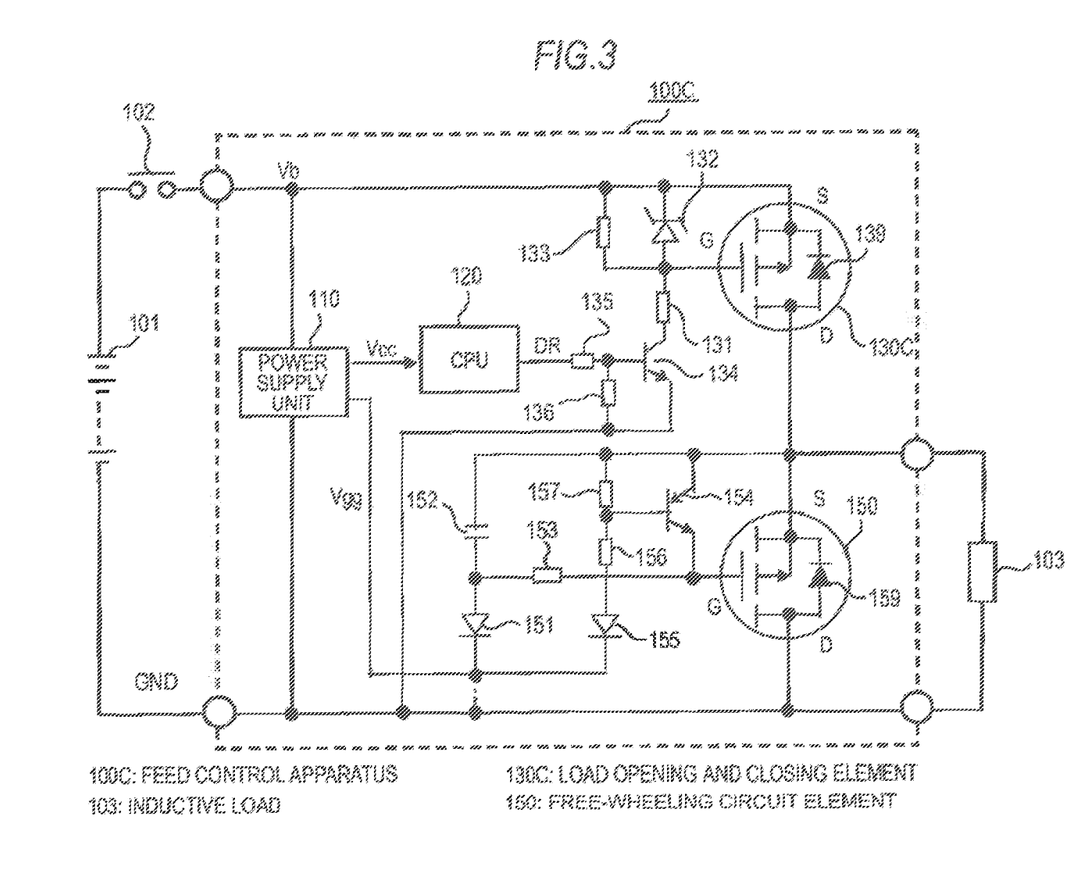
FIG. 3 is an overall circuit diagram of a feed control apparatus for an inductive load according to a third embodiment of the invention.

A configuration of a feed control apparatus for an inductive load according to a third embodiment of the invention will now be described in detail with reference to FIG. 3 showing an overall circuit diagram. Major differences from the first embodiment above are that a load opening and closing element 130C is connected at an upstream position of an inductive load 103 and that P-channel field effect transistors are employed as the load opening and closing element 130C and a free-wheeling circuit element 150 in the third embodiment. Reference numerals in FIG. 3 same as those in FIG. 1 denote same or equivalent portions.

Referring to FIG. 3, a feed control apparatus 100C is fed from a DC power supply 101, which is, for example, an in-vehicle battery, via a power supply switch 102, which is an output contact of a power supply relay, and feeds an inductive load 103, which is, for example, a magnet coil, so as to supply a predetermined exciting current by simply driving the inductive load 103 to be ON or OFF or by controlling an ON duty, which is a ratio of an ON time with respect to ON and OFF periods.

A power supply unit 110 provided inside the feed control apparatus 100C is fed with a power supply voltage Vb from the DC power supply 101 and generates a control voltage Vcc of a stabilized voltage, for example, of DC 5 V, as a predetermined stabilized voltage and an auxiliary voltage Vgg.

To an opening and closing command generation unit 120, the control voltage Vcc is applied and an opening and closing command signal DR is generated by an unillustrated in-built micro-processor.

A load opening and closing element 130C is, for example, a P-channel field effect transistor connected in series to the inductive load 103 on an upstream side. A signal voltage by the opening and closing command signal DR drives a drive transistor 134 to conduct via a base resistor 135. As a result, a divided voltage by a drive resistor 131 and a gate resistor 133 is applied between a source terminal S and a gate terminal G of the load opening and closing element 130C and the load opening and closing element 130C conducts between the source terminal S and a drain terminal D in a forward direction. The inductive load 103 is thus fed from the DC power supply 101 via the power supply switch 102. A constant voltage diode 132 connected in parallel to the gate resistor 133 is provided so as to prevent an excessively large voltage from being applied between the source terminal S and the gate terminal G of the load opening and closing element 130C.

In addition, an opened-circuit stabilizing resistor 136 is connected between a base terminal and an emitter terminal of the drive transistor 134, so that the drive transistor 134 is opened in a reliable manner when the logic level of the opening and closing signal DR is "L". As a result, conduction between the source terminal S and the drain terminal D of the load opening and closing element 130C is cut off and an exciting current that has been flown to the inductive load 103 is diverted to a free-wheeling circuit element 150 described below. The load opening and closing element 130C may be a PNP junction transistor. However, a field effect transistor is advantageous in that a closed-circuit inter-element voltage drop becomes extremely small and a power loss is suppressed. It should be noted, however, that when a field effect transistor is used, a parasitic diode 139 is generated between the drain terminal D and the source terminal S in a direction indicated in the drawing and the field effect transistor is not furnished with a cut-off function as an opening and closing element for a conduction direction in the parasitic diode 139.

The free-wheeling circuit element 150 is a P-channel field effect transistor connected in parallel to the inductive load 103. The free-wheeling circuit element 150 is configured in such a manner that an exciting current can be diverted therein through a parasitic diode 159 when the load opening and closing element 130C is opened. It should be noted, however, that the diverted current is not sustained in the parasitic diode 159 in practice because the free-wheeling circuit element 150 conducts backward in a direction from the drain terminal D to the source terminal S and a voltage drop caused by backward conduction is small.

A charge diode 151 forming a gate drive circuit for the free-wheeling circuit element 150 charges a capacitor 152 with a differential voltage between the power supply voltage Vb and the auxiliary voltage Vgg, (Vb−Vgg), in a period during which the load opening and closing element 130C is closed. A cutoff transistor 154 connected between a source terminal S and a gate terminal G of the free-wheeling circuit element 150 is driven to conduct via a cutoff diode 155 and a base resistor 156. As a result, the free-wheeling circuit element 150 is prevented from conducting in a forward direction (a direction opposite to the conduction direction in the parasitic diode 159). An opened-circuit stabilizing resistor 157 is connected between a base terminal and an emitter terminal of the cutoff transistor 154, which is a PNP junction transistor.

Also, the cutoff diode 155 is provided so as to prevent a backward voltage from being applied between the emitter and base terminals of the cutoff transistor 154 while the load opening and closing element 130C is opened. The cutoff diode 155 can be connected in series to the base resistor 156 as is shown in FIG. 3 or alternatively can be connected in parallel to the opened-circuit stabilizing resistor 157.

When the load opening and closing element 130C is opened, the cutoff transistor 154 ceases to conduct because emitter potential of the cutoff transistor 154 drops to or below negative terminal potential of the DC power supply 101, and also a charging voltage of the capacitor 152 is applied between the source terminal S and the gate terminal G of the free-wheeling circuit element 150 via the drive resistor 153, The free-wheeling circuit element 150 thus conducts backward in a direction from the drain terminal D to the source terminal S. The auxiliary voltage Vgg is applied to positive-electrode terminals of the charge diode 151 and the cutoff diode 155. It should be appreciated, however, that the positive-electrode terminals may be connected to a ground circuit GND connected to a negative terminal of the DC power supply 101 instead of the auxiliary voltage Vgg. In this case, it becomes necessary to use a large capacitor by increasing a withstand voltage of the capacitor 152 and power consumption of the base resistor 156 tends to increase. However, the cutoff diode 155 can be omitted. Also, the charges charged to the capacitor 152 are lost as an opened-circuit state of the load opening and closing element 130C continues. However, a circuit configuration herein is that a small-capacity capacitor can be used as the capacitor 152 because it is only necessary to maintain a gate voltage for the free-wheeling circuit element 150 in a period since an exciting current of the inductive load 103 is diverted until the exciting current is lost by attenuation.

(2) Detailed Description of Function and Operation

A function and an operation of the feed control apparatus for an inductive load of the third embodiment will now be described in detail.

Referring to FIG. 3, when the power supply switch 102 is closed and the power supply unit 110 is fed, the micro-processor in the opening and closing command generation unit 120 starts to operate with the control voltage Vcc generated by the power supply unit 110. Then, in response to an operation state of an input signal for the unillustrated micro-processor and the content of a control program, the opening and closing command generation unit 120 generates an opening and closing command signal DR exhibiting the logic level that shifts to "H" or "L".

When the logic level of the opening and closing command signal DR shifts to "H", the drive transistor 134 is closed and starts to conduct, so that a gate voltage is applied between the source terminal S and the gate terminal G of the load opening and closing element 130C. The load opening and closing element 130C is driven to conduct in a forward direction, that is, a direction from the source terminal S to the drain terminal D. An exciting current for the inductive load 103 is thus flown. It should be noted, however, that the free-wheeling circuit element 150 is in a non-conducting state because a gate voltage between the source terminal S and the gate terminal G of the free-wheeling circuit element 150 is cut off as the cutoff transistor 154 conducts, and also the capacitor 152 is charged via the charge diode 151.

When the logic level of the opening and closing signal DR shifts to "L", the drive transistor 134 is opened and cut off and a conducting state between the source terminal S and the drain terminal D of the load opening and closing element 130C is cut off. The exciting current for the inductive load 103 is thus temporarily diverted into the parasitic diode 159 of the free-wheeling circuit element 150. However, as the cutoff transistor 154 ceases to conduct and a charging voltage of the capacitor 152 is applied between the source terminal S and the gate terminal G via the drive resistor 153, the free-wheeling circuit element 150 starts to conduct backward in a direction from the drain terminal D to the source terminal S. The diverted current of the inductive load 103 is thus switched to the backward conduction circuit side from the side of the parasitic diode 159.

(3) Gist and Characteristics of Third Embodiment

As is obvious from the description above, a feed control apparatus for an inductive load of the third embodiment is the feed control apparatus 100C for an inductive load, including: the load opening and closing element 130C connected in series to the inductive load 103 fed from the DC power supply 101, and the free-wheeling circuit element 150 connected in parallel to the inductive load 103, to which an exciting current that has been flown to the inductive load 103 is diverted when the load opening and closing element 130C is changed from a closed-circuit feeding state to an opened-circuit cutoff state.

The free-wheeling circuit element 150 employs a P-channel field effect transistor. The feed control apparatus 100C includes: the cutoff transistor 154 that brings the free-wheeling circuit element 150 into a non-conducting state by short-circuiting the gate terminal G and the source terminal S of the free-wheeling circuit element 150, and the capacitor 152 that is charged via the charge diode 151 when the load opening and closing element 130C is closed; and the drive resistor 153 that opens the cutoff transistor 154 and also applies a charging voltage of the capacitor 152 between the gate terminal G and the source terminal S of the free-wheeling circuit element 150 when the load opening and closing element 130C is opened.

When the load opening and closing element 130C is opened, the free-wheeling circuit element 150 is driven to conduct in a direction same as a conduction direction in the parasitic diode 159 generated between the source terminal and the drain terminal.

The load opening and closing element 130C is connected at a positive-side upstream position of the inductive load 103. The free-wheeling circuit element 150 connected in parallel to the inductive load 103 is a P-channel field effect transistor, and the cutoff transistor 154 is a PNP junction transistor connected between the source terminal S and the gate terminal G of the free-wheeling circuit element 150.

As has been described, relating to the fifth characteristic of the invention, a P-channel field effect transistor is employed as the free-wheeling circuit element at a downstream position of the load opening and closing element and connected in parallel to the inductive load. The cutoff transistor connected between the source terminal and the gate terminal of this transistor employs a PNP junction transistor having a faster response speed than a field effect transistor.

Accordingly, when the load opening and closing element is closed, the cutoff transistor starts conducting faster than free-wheeling circuit element starts conducting and thereby inhibits conduction of the free-wheeling circuit element. Hence, there is a characteristic that it becomes possible to prevent the occurrence of a power-supply short circuit arising when the free-wheeling circuit element and the load opening and closing element conduct simultaneously.

Also, the base resistor 156 that drives the charge diode 151 connected in series to the capacitor 152 and the cutoff transistor 154 to conduct is connected to a negative-electrode terminal of the DC power supply 101 or the auxiliary voltage Vgg, which is a voltage lower than the power supply voltage Vb of the DC power supply 101, is applied to the base resistor 156.

As has been described above, relating to the sixth characteristic of the invention, either the base resistor that drives the charge diode connected in series to the capacitor and the cutoff transistor to conduct is connected to the negative-electrode terminal of the DC power supply or the auxiliary voltage, which is a voltage lower than the power supply voltage of the DC power supply, is applied to the base resistor.

Hence, there is a characteristic that because the base voltage of the cutoff transistor is equal to or higher than a zero voltage, the cutoff transistor conducts while the load opening and closing element is opened so that the free-wheeling circuit element can be prevented from ceasing to conduct. Also, there is a characteristic that in a case where the auxiliary voltage is used, not only does it become possible to suppress power consumed by driving the cutoff transistor to conduct while the load opening and closing element is closed, but it also becomes possible to lower a withstand voltage of the capacitor.

Fourth Embodiment (1) Detailed Description of Configuration

Figure 4:
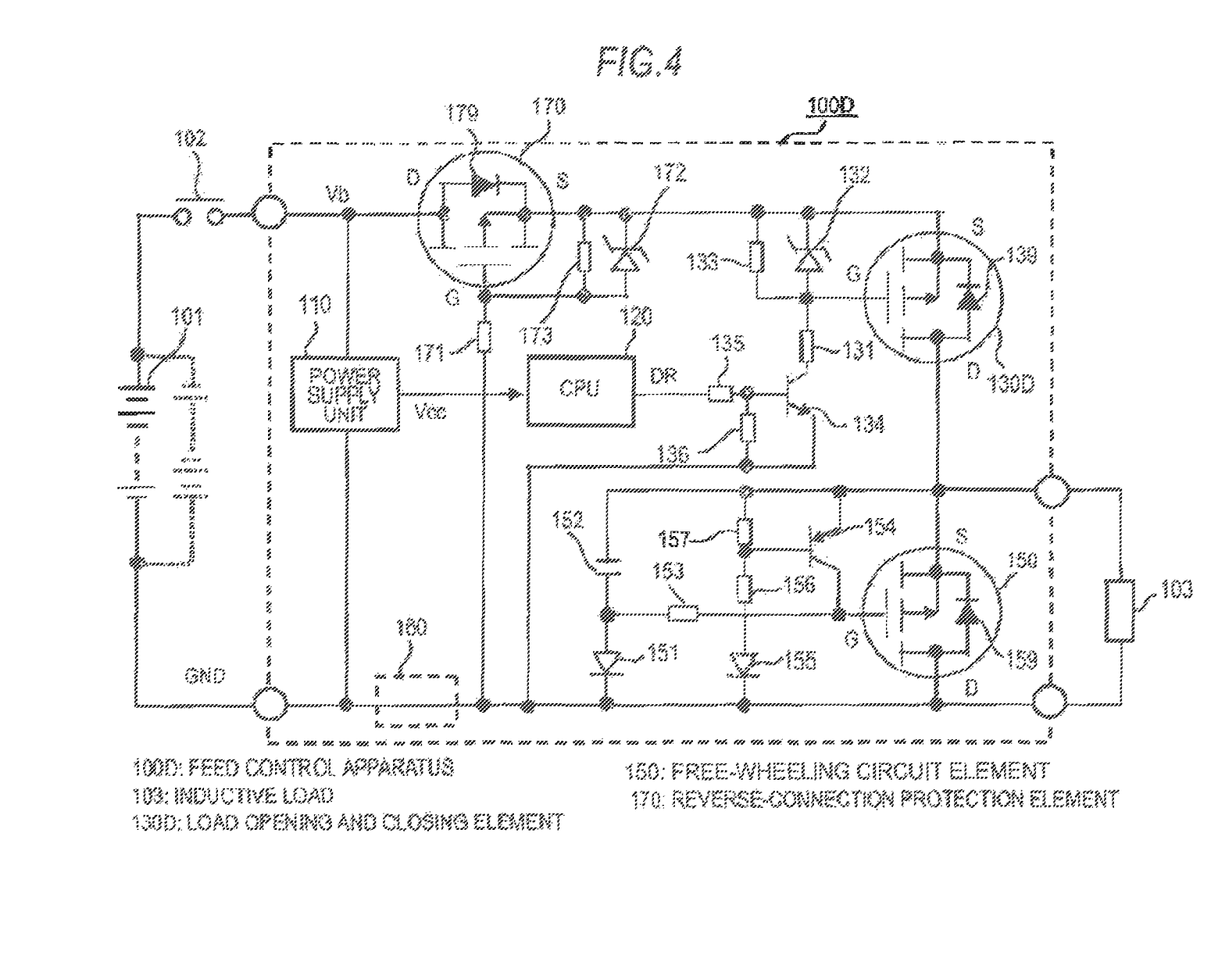
FIG. 4 is an overall circuit diagram of a feed control apparatus for an inductive load according to a fourth embodiment of the invention.

A configuration of a feed control apparatus for an inductive load according to a fourth embodiment of the invention, chiefly differences from the third embodiment above, will now be described in detail with reference to FIG. 4 showing an overall circuit diagram.

Major differences from the third embodiment above are that a reverse-connection protection element 170 is additionally provided so as to prevent the occurrence of a short circuit current in a case where a DC power supply 101 is erroneously connected in reverse polarity and that a power supply unit 110 does not have an auxiliary voltage Vgg in the fourth embodiment. Reference numerals in FIG. 4 same as those of FIG. 3 denote same or equivalent portions.

Referring to FIG. 4, a feed control apparatus 100D is fed from a DC power supply 101 via a power supply switch 102 and feeds an inductive load 103. A power supply unit 110 provided inside the feed control apparatus 100D is fed with a power supply voltage Vb from the DC power supply 101 and generates a control voltage Vcc. The control voltage Vcc is applied to an opening and closing command generation unit 120 and an opening and closing command signal DR is generated by an unillustrated micro-processor built in the opening and closing command generation unit 120.

On an upstream side of the inductive load 103, a reverse-connection protection element 170 and a load opening and closing element 130D, both of which are P-channel field effect transistors, are connected in series. The reverse-connection protection element 170 is configured in such a manner so as to conduct backward by a gate drive circuit described below.

A signal voltage by the opening and closing command signal DR drives a drive transistor 134 to conduct via a base resistor 135. As a result, a divided voltage by a drive resistor 131 and a gate resistor 133 is applied between a source terminal S and a gate terminal G of the load opening and closing element 130D. Hence, the load opening and closing element 130D conducts between the source terminal S and a drain terminal D in a forward direction. The inductive load 103 is thus fed from the DC power supply 101 via the power supply switch 102 and the reverse-connection protection element 170.

In addition, an opened-circuit stabilizing resistor 136 is connected between a base terminal and an emitter terminal of the drive transistor 134, so that the drive transistor 134 is opened in a reliable manner when the logic level of the opening and closing signal DR is "L". As a result, conduction between the source terminal S and the drain terminal D of the load opening and closing element 130D is cut off and an exciting current that has been flown to the inductive load 103 is diverted to a free-wheeling circuit element 150.

The free-wheeling circuit element 150 is a P-channel field effect transistor connected in parallel to the inductive load 103, and the free-wheeling circuit element 150 is configured in such a manner that an exciting current can be diverted therein via a parasitic diode 159 when the load opening and closing element 130D is opened. It should be noted, however, that the diverted current is not sustained in the parasitic diode 159 in practice because the free-wheeling circuit element 150 conducts backward in a direction from the drain terminal D to the source terminal S and a voltage drop caused by backward conduction is small.

A charge diode 151 forming a gate drive circuit for the free-wheeling circuit element 150 charges a capacitor 152 with the power supply voltage Vb in a period during which the load opening and closing element 130D is closed. Also, a cutoff transistor 154 connected between a source terminal S and a gate terminal G of the free-wheeling circuit element 150 is driven to conduct via a base resistor 156. As a result, the free-wheeling circuit element 150 is prevented from conducting in a forward direction (a direction opposite to the conduction direction in the parasitic diode 159). An opened-circuit stabilizing resistor 157 is connected between a base terminal and an emitter terminal of the cutoff transistor 154, which is a PNP junction transistor.

Also, the auxiliary voltage Vgg in the third embodiment above is not used in the fourth embodiment. Hence, the cutoff diode 155 (indicated by a broken line in FIG. 4) connected in series to the base resistor 156 is unnecessary herein. When the load opening and closing element 130D is opened, the cutoff transistor 154 ceases to conduct because emitter potential of the cutoff transistor 154 drops to or below negative terminal potential of the DC power supply 101, and also a charging voltage of the capacitor 152 is applied between the source terminal S and the gate terminal G of the free-wheeling circuit element 150 via the drive resistor 153. The free-wheeling circuit element 150 thus conducts backward in a direction from the drain terminal D to the source terminal S.

The power supply voltage Vb is applied to the gate terminal G of the reverse-connection terminal 170 via a drive resistor 171. In practice, however, a voltage divided by a gate resistor 173 connected between the gate terminal G and the source terminal S is applied and the applied voltage is limited by a constant voltage diode 172 so that a voltage as high as or higher than a clamping voltage allowed between the source terminal S and the gate terminal G is not applied even when the power supply voltage Vb fluctuates.

As a result, the revere connection protection element 170 conducts backward in a direction from the drain terminal D to the source terminal S, so that a voltage drop between the drain terminal D and the source terminal S during normal operation is suppressed by conducting in a direction same as the conduction direction in the internal parasitic diode 179. In a case where the DC power supply 101 is erroneously connected in reverse polarity as is indicated by a dotted line in the drawing, the reverse-connection protection element 170 ceases to conduct. It thus becomes possible to prevent the occurrence of a power-supply short circuit by a series circuit made up of the parasitic diode 139 in the load opening and closing element 130D and the parasitic diode 159 in the free-wheeling circuit element 150. Alternatively, the reverse-connection protection element 170 may be replaced with the reverse-connection protection element 160 described in the second embodiment above, in which case the reverse-connection protection element 160 is connected at the position indicated by a dotted line in FIG. 4.

(2) Detailed Description of Function and Operation

A function and an operation of the feed control apparatus for an inductive load of the fourth embodiment will now be described in detail.

Referring to FIG. 4, when the power supply switch 102 is closed and the power supply unit 110 is fed, the micro-processor in the opening and closing command generation unit 120 starts to operate with the control voltage Vcc generated by the power supply unit 110. Then, in response to an operation state of an input signal for the unillustrated micro-processor and the content of a control program, the opening and closing command generation unit 120 generates an opening and closing command signal DR exhibiting the logic level that shifts to "H" or "L". When the logic level of the opening and closing command signal DR shifts to "H", the drive transistor 134 is closed and starts to conduct, so that a gate voltage is applied between the source terminal S and the gate terminal G of the load opening and closing element 130D and the load opening and closing element 130D is driven to conduct in a forward direction, that is, a direction from the source terminal S to the drain terminal D. An exciting current for the inductive load 103 is thus flown. It should be noted, however, that the free-wheeling circuit element 150 is in a non-conducting state because a gate voltage between the source terminal S and the gate terminal G of the free-wheeling circuit element 150 is cut off as the cutoff transistor 154 conducts, and also the capacitor 152 is charged via the charge diode 151.

When the logic level of the opening and closing signal DR shifts to "L", the drive transistor 134 is opened and cut off and a conducting state between the source terminal S and the drain terminal D of the load opening and closing element 130D is cut off. The exciting current for the inductive load 103 is thus temporarily diverted to the parasitic diode 159 of the free-wheeling circuit element 150. However, as the cutoff transistor 154 ceases to conduct and a charging voltage of the capacitor 152 is applied between the source terminal S and the gate terminal G via the drive resistor 153, the free-wheeling circuit element 150 starts to conduct backward in a direction from the drain terminal D to the source terminal S. The diverted current of the inductive load 103 is thus switched to the backward conduction circuit side from the side of the parasitic diode 159.

On the other hand, in a case where the DC power supply 101 is connected in proper polarity, a voltage drop between the drain terminal D and the source terminal S is suppressed by allowing the reverse-connection protection element 170 to conduct in a direction same as the conduction direction in the internal parasitic diode 179. On the contrary, in a case where the DC power supply 101 is erroneously connected in reversed polarity, the occurrence of a power-supply short circuit abnormality is prevented by allowing the reverse-connection protection element 170 to cease to conduct.

(3) Gist and Characteristics of Fourth Embodiment

As is obvious from the description above, a feed control apparatus for an inductive load of the fourth embodiment is the feed control apparatus 100D for an inductive load, including: the load opening and closing element 130D connected in series to the inductive load 103 fed from the DC power supply 101, and the free-wheeling circuit element 150 connected in parallel to the inductive load 103, to which an exciting current that has been flown to the inductive load 103 is diverted when the load opening and closing element 130D is changed from a closed-circuit feeding state to an opened-circuit cutoff state.

The free-wheeling circuit element 150 employs a P-channel field effect transistor. The feed control apparatus 100D includes: the cutoff transistor 154 that brings the free-wheeling circuit element 150 into a non-conducting state by short-circuiting the gate terminal G and the source terminal S of the free-wheeling circuit element 150, and the capacitor 152 that is charged via the charge diode 151 when the load opening and closing element 130D is closed; and the drive resistor 153 that opens the cutoff transistor 154 and also applies a charging voltage of the capacitor 152 between the gate terminal G and the source terminal S of the free-wheeling circuit element 150 when the load opening and closing element 130D is opened. When the load opening and closing element 130D is opened, the free-wheeling circuit element 150 is driven to conduct in a direction same as a conduction direction in the parasitic diode 159 generated between the source terminal and the drain terminal.

The load opening and closing element 130D is a P-channel field effect transistor. The gate terminal of the load opening and closing element 130D is driven to open and close by an opening and closing command signal DR generated by the opening and closing command generation unit 120.

The opening and closing command generation unit 120 is fed from the power supply unit 110 fed from the DC power supply 101 and generates the predetermined control voltage Vcc. The reverse-connection protection element 170 connected in series to a series circuit made up of the free-wheeling circuit element 150 and the load opening and closing element 130D is further connected in series to the power supply unit 110 at an upstream position. The reverse-connection protection element 170 employs a P-channel field effect transistor including the parasitic diode 179, to which is connected the drive resistor 171 applying a gate voltage so that the reverse-connection terminal 170 is driven to close in a direction same as a conduction direction in the parasitic diode 179 when the DC power supply 101 is connected in proper polarity, and conduction of the reverse-connection protection element 170 is prevented when the DC power supply 101 is erroneously connected in reverse polarity.

As has been described above, relating to the second characteristic of the invention, the load opening and closing element employs a field effect transistor. The reverse-connection protection element, which is a field effect transistor, is connected in series to a series circuit made up of the load opening and closing element and the free-wheeling circuit element. The opening and closing command generation unit that applies an opening and closing command signal to the load opening and closing element is fed from the power supply unit connected between the DC power supply and the reverse-connection protection element. Hence, there is a characteristic that when the DC power supply is erroneously connected in reverse polarity, it becomes possible to prevent a power-supply short circuit using the internal parasitic diodes of the load opening and closing element and the free-wheeling circuit element. Also, there is a characteristic that a voltage drop by the reverse-connection protection element and the load opening and closing element during normal operation takes a sufficiently small value in comparison with that across one junction transistor, so that power consumption and a temperature rise due to heat generation can be suppressed.

Also, there is a characteristic that even in a case where the reverse-connection protection element is melted and disconnected by overheating due to a load short circuit abnormality, a positive-line earth fault abnormality of the load, or a negative-line power-supply fault abnormality of the load, the power supply unit and the opening and closing command generation unit can continue to operate normally and perform abnormality processing, such as to detect and notify the occurrence of an abnormality.

While the above has described the first embodiment through the fourth embodiment of the invention, it should be understood, however, that the respective embodiments can be combined without any limitation and the respective embodiments can be modified or omitted as the need arises within the scope of the invention.

Various modifications and alternations of this invention will be apparent to those skilled in the art without departing from the scope and spirit of this invention, and it should be understood that this is not limited to the illustrative embodiments set forth herein.

What is claimed is:

1. A feed control apparatus for an inductive load with a reduced power loss, the feed control apparatus comprising:
   a load opening and closing element connected in series to an inductive load fed from a DC power supply;
   a free-wheeling circuit element connected in parallel to the inductive load, to which an exciting current that has been flown to the inductive load is diverted when the load opening and closing element is changed from a closed-circuit feeding state to an opened-circuit cutoff state, wherein the free-wheeling circuit element employs one of N-channel and P-channel filed effect transistors;
   a cutoff transistor that brings the free-wheeling circuit element into a non-conducting state by short-circuiting a gate terminal and a source terminal of the free-wheeling circuit element when the load opening and closing element is closed;

a capacitor that is charged via a charge diode when the load opening and closing element is closed; and a drive resistor that opens the cutoff transistor and also applies a charging voltage of the capacitor between the gate terminal and the source terminal of the free-wheeling circuit element when the load opening and closing element is opened, in response to which the free-wheeling circuit element conducts in a same direction as a conduction direction in a parasitic diode formed between the source terminal and a drain terminal, wherein the cut-off transistor is closed when the load opening and closing element is closed, in response to which the free-wheeling circuit element is opened, an anode of the parasitic diode is formed adjacent a negative terminal of the inductive load, and a cathode of the parasitic diode is formed adjacent a positive terminal of the inductive load.

2. The feed control apparatus for an inductive load with a reduced power loss according to claim 1, wherein:

the load opening and closing element is one of N-channel and P-channel field effect transistors;

a gate terminal of the load opening and closing element is driven to open and close by an opening and closing command signal generated by an opening and closing command generation unit;

the opening and closing command generation unit is fed from a power supply unit fed from the DC power supply and generates a predetermined control voltage;

a reverse-connection protection element is connected in series to a series circuit made up of the free-wheeling circuit element and the load opening and closing element at one of a downstream position and an upstream position of the power supply unit; and the reverse-connection protection element employs one of N-channel and P-channel field effect transistors each including a parasitic diode, and is connected to a drive resistor applying a gate voltage so that the reverse-connection terminal is driven to close in a direction same as a conduction direction in the parasitic diode when the DC power supply is connected in proper polarity, and conduction of the reverse-connection protection element is prevented when the DC power supply is erroneously connected in reverse polarity.

3. The feed control apparatus for an inductive load with a reduced power loss according to claim 1, wherein:

the load opening and closing element is connected at a negative-side downstream position of the inductive load;

the free-wheeling circuit element is an N-channel filed effect transistor; and the cutoff transistor is an NPN junction transistor connected between the gate terminal and the source terminal of the free-wheeling circuit element.

4. The feed control apparatus for an inductive load with a reduced power loss according to claim 1, wherein:

the load opening and closing element is connected at a negative-side downstream position of the inductive load;

the free-wheeling circuit element is an N-channel field effect transistor and the cutoff transistor is an NPN junction transistor connected between the gate terminal and the source terminal of the free-wheeling circuit element; and one of a power supply voltage of the DC power supply and an auxiliary voltage, which is a voltage lower than the power supply voltage of the DC power supply, is applied to a series circuit of the capacitor and the charge diode and to a base resistor that drives the cutoff transistor to conduct.

5. The feed control apparatus for an inductive load with a reduced power loss according to claim 1, wherein:

the load opening and closing element is connected at a positive-side upstream position of the inductive load;

the free-wheeling circuit element connected in parallel to the inductive load is a P-channel field effect transistor; and the cutoff transistor is a PNP junction transistor connected between the gate terminal and the source terminal of the free-wheeling circuit element.

6. The feed control apparatus for an inductive load with a reduced power loss according to claim 1, wherein:

the load opening and closing element is connected at a positive-side upstream position of the inductive load;

the free-wheeling circuit element connected in parallel to the inductive load is a P-channel field effect transistor;

the cutoff transistor is a PNP junction transistor connected between the gate terminal and the source terminal of the free-wheeling circuit element; and a series circuit of the capacitor and the charge diode and a base resistor that drives the cutoff transistor to conduct are configured in one of a manner in which the series circuit and the base resistor are connected to a negative-electrode terminal of the DC power supply and in a manners in which an auxiliary voltage, which is a voltage lower than a power supply voltage of the DC power supply, is applied to the base resistor.

* * * * *